(12) United States Patent
James-Roxby

(10) Patent No.: US 7,552,405 B1
(45) Date of Patent: Jun. 23, 2009

(54) METHODS OF IMPLEMENTING EMBEDDED PROCESSOR SYSTEMS INCLUDING STATE MACHINES

(75) Inventor: Philip B. James-Roxby, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 208 days.

(21) Appl. No.: 11/880,723

(22) Filed: Jul. 24, 2007

(51) Int. Cl.
*G06F 17/50* (2006.01)
*H03K 17/693* (2006.01)

(52) U.S. Cl. .................................. 716/3; 716/2; 716/16
(58) Field of Classification Search ...................... 716/2, 716/3, 16
See application file for complete search history.

(56) References Cited

U.S. PATENT DOCUMENTS

| | | | |
|---|---|---|---|
| 5,280,595 A | 1/1994 | Lemay et al. | |
| 5,892,900 A | 4/1999 | Ginter et al. | |
| 6,618,839 B1 | 9/2003 | Beardslee et al. | |
| 6,904,577 B2 | 6/2005 | Schubert et al. | |
| 6,931,572 B1 | 8/2005 | Schubert et al. | |
| 6,981,232 B1 * | 12/2005 | Lien et al. ....................... | 716/3 |
| 7,007,264 B1 | 2/2006 | Baxter | |
| 7,114,055 B1 * | 9/2006 | Baxter .......................... | 712/37 |
| 7,131,077 B1 | 10/2006 | James-Roxby et al. | |
| 7,496,490 B2 * | 2/2009 | Tatsuoka et al. .............. | 703/14 |
| 2002/0161907 A1 | 10/2002 | Moon | |
| 2005/0108662 A1 * | 5/2005 | Morfey et al. .................. | 716/1 |
| 2007/0168749 A1 * | 7/2007 | Stewart et al. ................ | 714/39 |
| 2007/0294675 A1 * | 12/2007 | Barraclough et al. ......... | 717/137 |
| 2008/0059776 A1 * | 3/2008 | Sung et al. .................... | 712/226 |
| 2008/0082794 A1 * | 4/2008 | Yu et al. ....................... | 712/218 |
| 2008/0126753 A1 * | 5/2008 | Chao et al. ..................... | 712/34 |
| 2008/0183931 A1 * | 7/2008 | Verm et al. ................... | 710/260 |
| 2008/0263342 A1 * | 10/2008 | Knowles et al. .............. | 712/244 |
| 2008/0282072 A1 * | 11/2008 | Leonard et al. .............. | 712/241 |
| 2009/0006814 A1 * | 1/2009 | Lie ............................. | 712/208 |

OTHER PUBLICATIONS

Eric Keller et al.; "Software Decelerators"; 13th International Field Programmable Logic and Applications Conference (FPL); Sep. 1-3, 2003; Lecture Notes in Computer Science 2778; pp. 1-10.

(Continued)

*Primary Examiner*—Jack Chiang
*Assistant Examiner*—Suresh Memula
(74) *Attorney, Agent, or Firm*—Lois D. Cartier

(57) ABSTRACT

Methods of implementing state machines using embedded processors. The designer specifies the logical footprint of the state machine in a formalism that can be transformed into hardware. This approach decouples the designer from the design, so that a state machine can be moved between embedded processors (e.g., between a hard processor and a soft processor), without any modifications to the code. One or more source-to-source transformations can be performed to improve the run-time performance of the state machine. These transformations can include the insertion of one or more jump addresses directly into the code, bypassing the standard lookup table approach for memory addressing, and consequently speeding up the execution of the code. The jump addresses can include, for example, a jump address for the start of each state machine, and/or a jump address for each state within the state machines.

20 Claims, 2 Drawing Sheets

OTHER PUBLICATIONS

IBM Microelectronics; "CoreConnect Bus Architecture—A 32-, 64-, 128-bit core on-chip bus standard"; available from IBM at http://www.chips.ibm.com; Copyright International Business Machines Corporation 1999; pp. 1-2.

IBM; "The CoreConnect Bus Architecture"; available from IBM; Copyright International Business Machines Corporation, 1999; pp. 1-8.

Chen et al.; "A Model Driven XML Transformation Framework for Business Performance Management"; copyright 2005 IEEE; Proceedings of the 2005 IEEE International Conference on e-Business Engineering; pp. 1-8.

Xilinx, Inc.; U.S. Appl. No. 11/228,938 by James-Roxby et al., filed on Sep. 16, 2005 by Xilinx, Inc.

* cited by examiner

METHODS OF IMPLEMENTING EMBEDDED PROCESSOR SYSTEMS INCLUDING STATE MACHINES

FIELD OF THE INVENTION

The invention relates to state machine systems and methods. More particularly, the invention relates to efficient methods of implementing state machines using embedded processors.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

In order to improve the usefulness of a PLD, a hardware processor core, such as the PowerPC® processor of IBM Corp. of Armonk, N.Y., can be embedded in the programmable logic, for example, as in the Virtex™-II Pro FPGA from Xilinx, Inc. of San Jose, Calif. The availability of an embedded processor core can significantly increase the efficiency and operating speed of systems implemented in the FPGA containing the core.

Another way of embedding a processor in a PLD design is to implement a "soft processor" that uses the programmable fabric of the PLD itself to implement the processor. For example, the MicroBlaze™ processor core from Xilinx, Inc. is an example of such a software core.

The software for state machines using embedded processors is typically produced using ad-hoc C code techniques, although some formalisms exist. For example, in U.S. Pat. No. 7,131,077 ("Using an Embedded Processor to Implement a Finite State Machine", which is hereby incorporated herein by reference), James-Roxby and Keller describe a system using an XML (eXtensible Mark-up Language) to specify the required behavior of a state machine. Similarly, the interfacing of the processor to the hardware fabric is normally ad-hoc, although it can be automatically generated as described in U.S. Pat. No. 7,131,077.

It is desirable to provide further formalisms based around state machine interactions and C code, in order to further improve the design process for systems in which state machines are implemented using either hardware or software processor cores, or both hardware and software cores.

SUMMARY

The invention provides methods of implementing state machines using embedded processors. The designer specifies the logical footprint of the state machine in a formalism that can be transformed into hardware. This approach decouples the designer from the design, so that a state machine can be moved between embedded processors (e.g., between a hard processor and a soft processor), without any modifications to the code. A further advantage is that one or more source-to-source transformations can be performed to improve the run-time performance of the state machine. These transformations can include the insertion of one or more jump addresses directly into the code, bypassing the standard lookup table approach for memory addressing, and consequently speeding up the execution of the code. The jump addresses can include, for example, a jump address for the start of each state machine, and/or a jump address for each state within the state machines.

Another embodiment includes an article of manufacture including a computer-usable medium having computer-usable program code that, when executed by a computer, causes the computer to perform the various steps and/or functions disclosed herein.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of systems including state machines implemented using embedded processors. The present invention has been found to be particularly applicable and beneficial for programmable logic devices (PLDs). An appreciation of the present invention is presented by way of specific examples utilizing PLDs such as field programmable gate arrays (FPGAs). However, the present invention is not limited by these examples.

Figure 1:
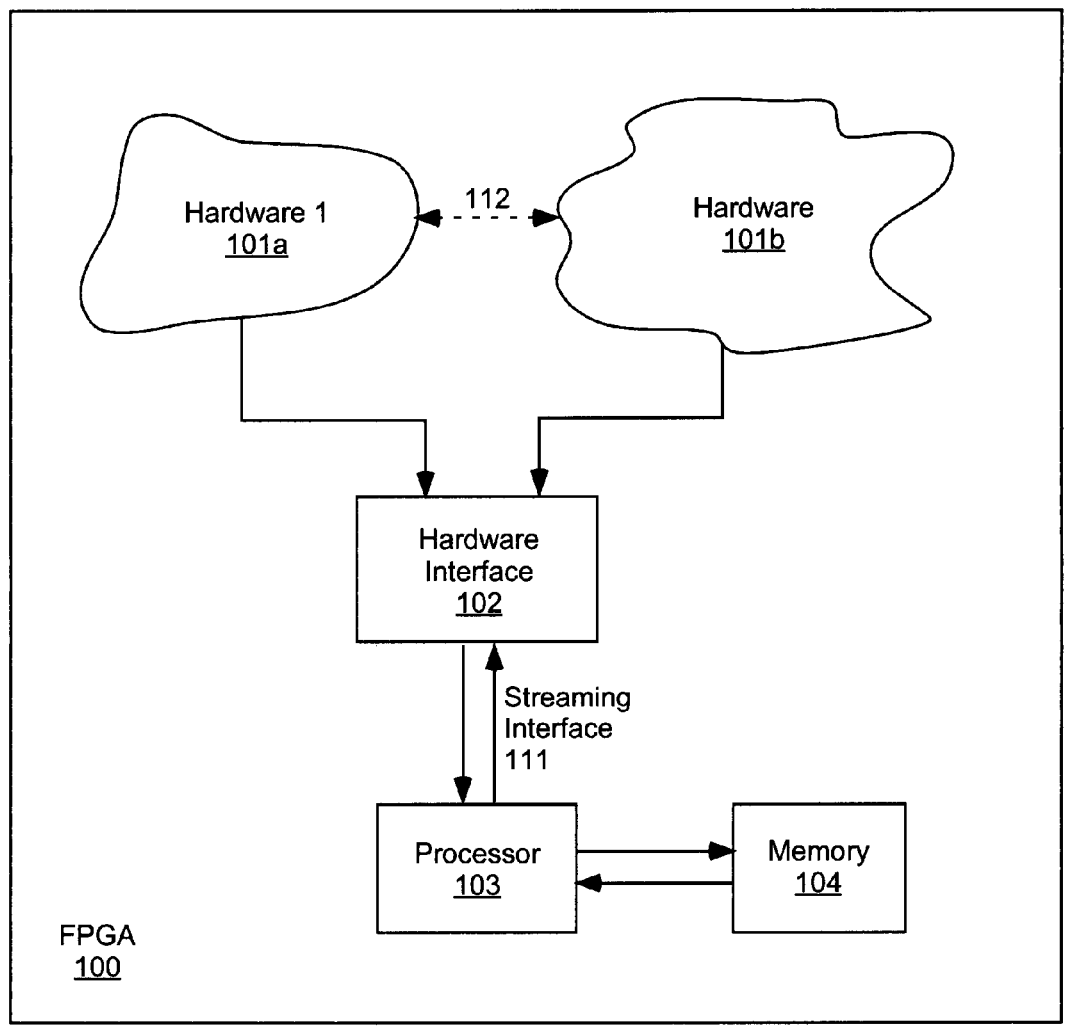
FIG. 1 illustrates in simplified form a system in a programmable logic device (PLD) that includes an embedded processor and a hardware interface thereto.

FIG. 1 illustrates a system implemented in a PLD 100, in this example a field programmable gate array (FPGA) such as a Virtex-II Pro device from Xilinx, Inc. Implemented in the FPGA are hardware circuits 101a and 101b, which may communicate with each other via optional interconnect lines 112. Hardware circuits 101a-b may be implemented, for example, in the programmable fabric of the FPGA. Each of the hardware circuits communicates with an embedded processor 103 via a hardware interface 102. Processor 103 is coupled to the hardware interface via a streaming interface 111, e.g., "FSL" for the MicroBlaze soft processor, or "APU" for the PowerPC hard processor. Processor 103 accesses data and/or instructions from a memory block 104, e.g., a block RAM in a Xilinx FPGA.

Processor 103 can be used, for example, to implement one or more state machines that form a part of the system. These state machines can be used, for example, to monitor signals from hardware circuits 101a and/or 101b. In one embodiment, several state machines are implemented in processor 103, wherein each state machine has only one input, and monitors that input for a change in value. When the input value changes, the state machine changes state. One or more output values denoting the new state can then be provided to one or both of the hardware circuits. Such a state machine is called a "handler".

A state machine is typically specified in terms of inputs, outputs, and states. One common type of state machine has only one input (e.g., one input vector having one or more bits), although the number of outputs is not limited. Further, in this type of state machine the input signals cannot directly produce output signals. A Moore state machine, for example, is constructed in such a way as to allow outputs to be produced based on states, but not on inputs. This type of state machine can be used, for example, for processing serial data streams, e.g., implementing a UART (Universal Asynchronous Receiver Transmitter) or other serial protocols.

Figure 2:
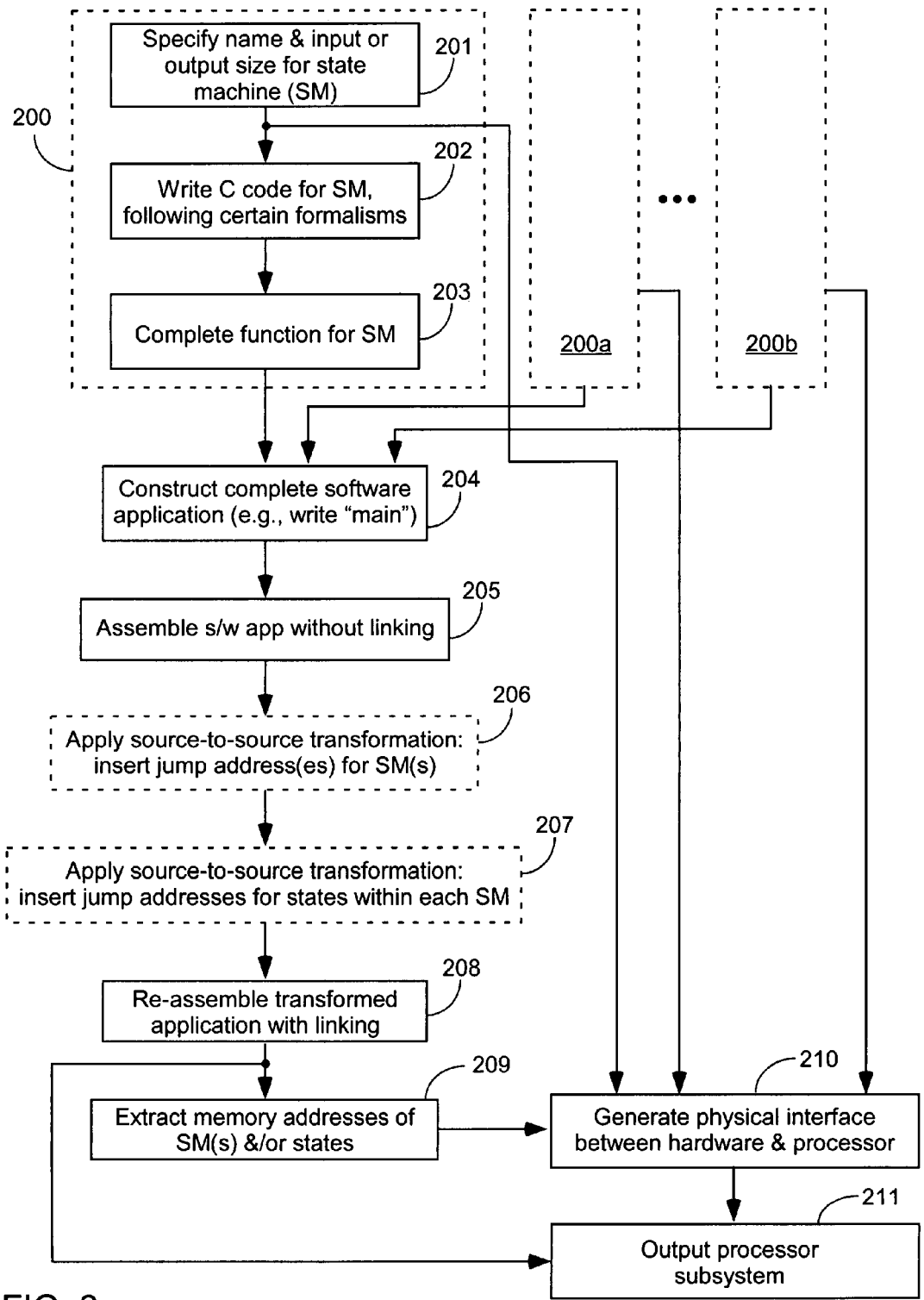
FIG. 2 illustrates the steps of an exemplary method of implementing an embedded processor system, wherein the system includes state machines implemented in the embedded processor.

FIG. 2 illustrates the steps of a method of implementing a system including one or more single-input state machines using an embedded processor. Steps 201-203 (flows 200, 200a, . . . 200b) are executed once for each state machine. The remaining steps are executed once for the system. Steps 203-210 may be executed automatically by a computer, thereby simplifying the construction process for the system.

In step 201, the name of the state machine and the size of the input (e.g., the number of bits in the input vector) or the output (e.g., the number of bits in the output vector) are specified. The input/output can be a single bit, as in the case of a UART, or multi-bit, as in the case of a PHY for an Ethernet controller. (A "PHY" is a special electronic integrated circuit or functional block of a circuit that takes care of encoding and decoding between a pure digital domain and a modulation in the analog domain. For example, a PHY is often used to interface an FPGA or CPLD to a specific type of interface.) The state machine name and the input/output size can be specified, for example, using an XML (eXtensible Mark-up Language) file. However, any mechanism that captures this information can be used.

In step 202, the C code for the state machine is written, with a number of formalisms, based on the information entered in step 201. (Note: while C code is used in the examples herein, other high-level languages can be used, alternatively or additionally, in one or more of the state machines.) The first formalism is that the C code does not explicitly read the input, or declare a variable for the input. Rather, the C code just refers to the name of the input, which is capable of being a variable in C. Therefore, for example, "$" is not acceptable as an input name, nor is "my input", but "myInput" or "my_input" is acceptable. The second formalism is that the designer does not declare a variable for holding the state. Instead, the user simply refers to the name of the state machine followed by the word "State". Therefore, for example, the user of a state machine called "RXhandler" refers to "RXhandlerState". (Clearly, in other embodiments words other than "State" can be used.) The user is able to read and/or write to this variable. These formalisms ensure that the C code for the state machine is independent of a specific processor implementation. For example, when these formalisms are followed the same C code can be used with either the MicroBlaze soft processor or the PowerPC hard processor in a Xilinx FPGA.

Outputs are handled in the same way as inputs. Each output can either have its own state variable, or can refer to the state variable of other state machines. If an output refers to the state variable of one or more other state machines, the result is a Moore state machine. This linkage is performed using the mechanism described above for inputs, e.g., the state variable for a state machine called "foo" would be "fooState". All state variables are global variables. Therefore, there is no problem with scope when this approach is used. As in the case of the inputs, the user does not declare a variable for the output signal or explicitly write an output. Instead, by making assignments to a signal with the same declared name as the description, e.g., at the end of the block of code, the final value will be written into the logic.

One method of implementing a state machine is to write a case statement. However, while a case statement may be the most straightforward method of coding a state machine, other methods can also be used. For example, if-then-else statements are used in some embodiments.

As noted above, the remaining steps shown in FIG. 2 can be performed automatically by a computer.

In step 203, the implementation of the state machine is completed by adding variable declarations and adding any other features necessary in order to compile the C program from step 202.

In step 204, the transformation of the state machine description into a system begins by constructing the complete software application, e.g., the main( ) procedure. The overall application is constructed as an event handling loop, which reads from a streaming interface (e.g., FSL for the MicroBlaze soft processor, or APU for the PPC hard processor). Based on the received word, the application then jumps to the state machine handling the input or the output.

In some embodiments, each state machine is augmented with extra code to read inputs at the beginning of the state machine, and/or to write outputs at the end of the state machine. This code can be automatically included in the state machine based on the size information specified in step 201.

In an exemplary embodiment, the output of step 204 is as follows:

```
int main (void) {
    handlerFunc handlers[5];
    handlers[0]=&RXpin;
    handlers[1]=&intrPin;
    handlers[2]=&TXpin;
    handlers[3]=&wrRegisterInterface;
    handlers[4]=&rdRegisterInterface;
    packetType packet;
    while (1) {
    geffsl(packet, 0);
``` handlers[packet]( );
  }
}

This code instantiates five state machines (handlers), each of which is called when there is a change on the associated input pin. When a value appears on the streaming interface (e.g., the FSL port) from the hardware interface, the appropriate state machine is called and the "packet" of information is passed to the state machine. This packet can include, for example, the state machine identifier, and any inputs for the state machine. Such a packet is described, for example, in co-pending U.S. patent application Ser. No. 11/228,938, entitled "Method and Apparatus for Providing an Interface Between a Logic Circuit and a Processor" and filed Sep. 16, 2005, which is hereby incorporated herein by reference.

In step 205, the code is assembled, but not linked. In one embodiment, a ".s" file is produced, which contains the assembled code in a textual format. After assembly in step 205 for the MicroBlaze soft processor with −O3 optimization, for example, the above code is optimized to the following:

```
00000c38:
    c38: 30e00168      addik    r7, r0, 360     // 168
    c3c: 30c00604      addik    r6, r0, 1540    // 604
    c40: 30a00668      addik    r5, r0, 1640    // 668
    c44: 30800a48      addik    r4, r0, 2632    // a48
    c48: 30600ae4      addik    r3, r0, 2788    // ae4
    c4c: 3021ffc0      addik    r1, r1, −64
    c50: fa61003c      swi      r19, r1, 60
    c54: d9e00800      sw       r15, r0, r1
    c58: f8e1001c      swi      r7, r1, 28
    c5c: f8c10020      swi      r6, r1, 32
    c60: f8a10024      swi      r5, r1, 36
    c64: f8810028      swi      r4, r1, 40
    c68: f861002c      swi      r3, r1, 44
    c6c: 3261001c      swi      r19, r1, 28
  2 c70: 6d400000      get      r10, rfs10
    c74: 112a5000      addk     r9, r10, r10
    c78: 11294800      addk     r9, r9, r9
  2 c7c: c9099800      lw       r8, r9, r19
    c80: 99fc4000      brald    r15, r8
  2 c84: 80000000      or       r0, r0, r0
    c88: b800ffe8      bri      −24             // c70
```

At this stage, source to source transformations can be applied (steps 206-207). An optional first transformation (step 206) inserts jump addresses for the state machines into the code. An optional second transformation (step 207) inserts jump addresses for the states within each state machine. In one embodiment, step 206 is performed, and step 207 is omitted. In another embodiment, step 206 is omitted, and step 207 is performed. In yet another embodiment, both steps 206 and 207 are performed.

In step 206, the first transformation is applied to the actual body of main( ). When current methods are used, a table is constructed of jump addresses, and an ID is read through a streaming interface (e.g., an FSL for the MicroBlaze soft processor in the present example). The ID is quadrupled (e.g., by performing the "addk" command twice in the example above), forming an offset into the table. A value is retrieved from the table, based on the quadrupled ID and a base address for the table (specified using the "lw" command in the example above) and a jump is made. In contrast, in the exemplary embodiment above, the interface produces the jump address (stored in register r8), which is then read from the streaming interface, and the jump is made (e.g., using the "brald" (branch and link) command in the above example). As far as is known, the jump address cannot be specified using C code. This behavior can only be specified at the assembly language level, as in the above example. However, both methods rely on the interface producing the correct result. The resulting transformed code is as follows:

```
00000c38:
    c38:   addik  r7, r0, 360     // 168
    c3c:   addik  r6, r0, 1540    // 604
    c40:   addik  r5, r0, 1640    // 668
    c44:   addik  r4, r0, 2632    // a48
    c48:   addik  r3, r0, 2788    // ae4
    c4c:   addik  r1, r1, −64
    c50:   swi    r19, r1, 60
    c54:   sw     r15, r0, r1
    c58:   swi    r7, r1, 28
    c5c:   swi    r6, r1, 32
    c60:   swi    r5, r1, 36
    c64:   swi    r4, r1, 40
    c68:   swi    r3, r1, 44
    c6c:   swi    r19, r1, 28
  2 c70:   0  get    r10, rfs10
    c80:   brald  r15, r10
  2 c84:   or     r0, r0, r0
    c88:   bri    −24             //c70
```

The second transformation (step 207) is applied to the state machines themselves, and only when the state machines to be transformed are designed using a case statement, with successive indexes for branches. The way in which case statements are implemented is similar to the jump address described previously. A table is constructed in memory for each branch value, and the state variable is used as an index into this table. When known methods are used, executing this series of steps takes several cycles, because the index is quadrupled to make a word aligned index, and a read from a memory is required. By applying this transformation, this process can be significantly improved in speed, by avoiding one of the memory accesses. The jump address is stored in a register, rather than being read from a table.

The assembled output of the top of a case statement before the second transformation can appear as follows, for example:

APP
    get r5,rfs10
$LM3:
    .stabn 68,0,32,$LM3-RXpin

```
#NO__APP
        addi     r18,r0,5
        cmpu     r18,r20,r18
        blti     r18,$L22
        addk     r3,r20,r20
        addk     r3,r3,r3
        lwi      r4,r3,$L20
        bra      r4
        .rodata
        .align   2
$L20:
        .gpword        $L3
        .gpword        $L7
        .gpword        $L12
        .gpword        $L18
        .gpword        $L17
        .gpword        $L19
        .text
```

In this code, the index is initially compared against the maximum value covered by the case statement, and a branch is made if the maximum value is exceeded. This approach is not well suited to state machines, where every case needs to be specified. In the first transformation, the index was quadrupled and indexed into a table of jump locations, and the jump was made. The second transformation simply does away with an index altogether. Instead, the register assigned to the state machine stores the address of the jump to be made. Therefore, the code after the second transformation appears as follows, where r20 is the register assigned by the process to the exemplary state machine.

APP
   get r5,rfs10

$LM3:
   .stabn 68,0,32,$LM3-RXpin

NO_APP
   bra r20

As with the result of the first transformation, the result of the second transformation cannot be specified in C code.

One special case occurs when the user would have written: rxState=PROCESS_PARITY; and PROCESS_PARITY was #defined to an integer value which will be replaced by a pre-processor. If the code is written in this manner, a standard process would load rxState with the address of the part of the program that deals with PROCESS_PARITY, which again cannot be specified in C code. Therefore, as an alternative, this special case is handled by maintaining a list of the jump addresses (given in the untransformed code as gpwords). Whenever an assignment is made to a state machine register, the value written is replaced with the equivalent jump address. For example, when the following statement appears:
   addik r20, r0, 0

(meaning set register r20 to the integer value of state zero), this statement is transformed to read:
   addik r20, 0, $L3 which means set r20 to the address of the label $L3, which is the part of the program dealing with state 0. By this mechanism, it is possible to support Moore state machines. Prior to transformation, the code dealing with the output section might make references to the register allocated to the state (in this example, register r20). During the transformation, all operations using this register are transformed to use the labels instead of the integer values. Since the labels have global scope and are all unique, there is no problem referring to a label from a different function.

All state registers should be initialized to their first values, corresponding in each case to the state 0 of the register. This initialization can be performed, for example, by a further transformation in main to set all the required state registers to the value corresponding to the address of each of the machine's "state 0". This step is performed because addresses are used, and not IDs. (When current methods are used, the automatic initialization of values to 0 can be relied upon, which then corresponds to the first state into which the machine will be placed.) However, this initialization step is performed only once per program execution, so it detracts little from the time advantage gained by performing the transformation.

In step 208, the program is re-assembled and linked to fix instructions to their required positions in memory. In step 209, the memory addresses of the actual state machines and/or the states are extracted from the output of step 208. These memory addresses are required for the physical interface. The memory addresses can be extracted, for example, by disassembling a binary file from step 208 to produce a textual file, and then extracting the memory addresses from the textual file.

In step 210, the physical interface is generated using the memory position information from step 209 and the names and input or output sizes of the state machines specified in steps 201. The physical interface can be generated, for example, in a similar manner to that described by James-Roxby in co-pending U.S. patent application Ser. No. 11/228,938, which is referenced above.

Additional circuitry may be added to handle the input and output values. This additional circuitry may include ping-pong registers, for example. For inputs, the ping-pong registers are filled by the rest of the system. Once a ping-pong register is half full, the jump address for the state machine handling the input is sent to the processor, followed by the value in the ping-pong register. The jump address is hard-coded into the interface, but since the interface is automatically generated, it is straightforward to set the address. As described above, the address of the state machine is easily accessed from the disassembled output, and so is easily folded into the interface.

Outputs of the state machine can be handled in a similar manner. A ping-pong register is present for each output, and the contents of half of the register are presented to the rest of the system. The register sends the jump address of the state machine handling the output to the processor, and the processor then jumps to this location and executes. The end result of this execution is a value sent back to the ping-pong register. The overall timing is then derived from when the ping-pong registers appear half full on the inputs and outputs. By careful clock selection, the designer can match the overall performance of the processor-implemented state machine against the performance of the rest of the system. Also, if the processor load is low, the described method naturally supports running multiple state machines on the processor. Each state machine simply has different associated inputs and outputs, with different jump addresses.

The rest of the system interfaces to the processor via the ping-pong registers, with the main interfacing details (such as the use of FSLs, for example) being hidden from the user. The part of the system driven by outputs of the processor-implemented state machine has no way of knowing that these outputs are driven from a processor. They appear exactly as logical outputs. Similarly, the inputs are silently sampled by the ping-pong register, using a clock from the rest of the system.

At this stage, there is enough information to generate the complete processor subsystem. In step 211, the complete processor subsystem is generated using the physical interface from step 210 and the re-assembled code from step 208, and the subsystem is output. As used herein, the term "output" or "outputting" can mean, without limitation, writing to a file, writing to a user display or other output device, playing audible notifications or providing other physical feedback to a user, sending or transmitting to another system, exporting, or the like. In some embodiments, simulations or netlists (not shown) are automatically generated from this final description.

The flowcharts in the figures illustrate the architecture, functionality, and operation of possible implementations of systems, methods, and computer program products according to various embodiments of the present invention. In this regard, each block in the flowcharts may represent a module, segment, or portion of code, which comprises one or more portions of computer-usable program code that implements the specified logical function(s).

The present invention can be realized in hardware, software, or a combination of hardware and software. Any kind of computer system or other apparatus adapted for carrying out the methods described herein is suitable for their implementation. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

This invention can be embodied in other forms without departing from the spirit or essential attributes thereof. Accordingly, reference should be made to the following claims, rather than to the foregoing specification, as indicating the scope of the invention.

What is claimed is:

1. A method, comprising:
   specifying a name and input or output size for a first state machine;
   writing first code for the first state machine using a high-level language, the first code being independent of a processor implementation; and
   executing computer-implemented code to implement a processor subsystem including the first state machine, the executing comprising:
   providing first variable declarations for the first code;
   constructing a complete software application including the first code and the first variable declarations;
   assembling the complete software application wherein assembled and unlinked code is generated;
   applying a source-to-source transformation to the assembled and unlinked code, the source-to-source transformation inserting a jump address into the assembled and unlinked code;
   re-assembling the assembled and unlinked code after applying the source-to-source transformation, wherein assembled and linked code is generated;
   extracting the jump address from the assembled and linked code;
   generating an implementation of a physical interface for a processor in the processor subsystem utilizing the extracted jump address and the specified name and input or output size for the first state machine; and
   outputting the implementation of the processor subsystem utilizing the assembled and linked code and the implementation of the physical interface.

2. The method of claim 1, wherein the processor comprises an embedded processor in a programmable logic device (PLD).

3. The method of claim 2, wherein the physical interface is coupled between the processor and a hardware circuit implemented in the PLD.

4. The method of claim 3, wherein the hardware circuit is implemented in programmable fabric of the PLD.

5. The method of claim 1, wherein the high-level language is C.

6. The method of claim 1, wherein the applying the source-to-source transformation comprises inserting a jump address for the first state machine into the assembled and unlinked code.

7. The method of claim 1, wherein the applying the source-to-source transformation comprises inserting jump addresses for states within the first state machine into the assembled and unlinked code.

8. The method of claim 1, wherein:
   the method further comprises:
   specifying a name and input or output size for a second state machine, and
   writing second code for the second state machine using the high-level language, the second code being independent of the processor implementation;
   the executing further comprises providing second variable declarations for the second code;
   the complete software application further includes the second code and the second variable declarations; and
   the generating further utilizes the specified name and input or output size for the second state machine.

9. The method of claim 8, wherein the applying the source-to-source transformation comprises inserting jump addresses for the first and second state machines into the assembled and unlinked code.

10. The method of claim 8, wherein the applying the source-to-source transformation comprises inserting jump addresses for states within the first and second state machines into the assembled and unlinked code.

11. An article of manufacture, comprising:
    a computer-readable storage medium comprising computer-executable code for implementing a processor subsystem including a first state machine, the medium comprising:
    code for providing first variable declarations for the first code, based on previously specified name and input or output size for a first state machine;
    code for constructing a complete software application including first code and the first variable declarations, wherein the first code describes the first state machine using a high-level language, the first code being independent of a processor implementation;
    code for assembling the complete software application wherein assembled and unlinked code is generated;
    code for applying a source-to-source transformation to the assembled and unlinked code, the source-to-source transformation inserting a jump address into the assembled and unlinked code;
    code for re-assembling the assembled and unlinked code after applying the source-to-source transformation, wherein assembled and linked code is generated;
    code for extracting the jump address from the assembled and linked code;
    code for generating an implementation of a physical interface for a processor in the processor subsystem utilizing the extracted jump address and the specified name and input or output size for the first state machine; and
    code for outputting the implementation of the processor subsystem utilizing the assembled and linked code and the implementation of the physical interface.

12. The article of manufacture of claim 11, wherein the processor comprises an embedded processor in a programmable logic device (PLD).

13. The article of manufacture of claim 12, wherein the physical interface is coupled between the processor and a hardware circuit implemented in the PLD.

14. The article of manufacture of claim 13, wherein the hardware circuit is implemented in programmable fabric of the PLD.

15. The article of manufacture of claim 10, wherein the high-level language is C.

16. The article of manufacture of claim 10, wherein the code for applying the source-to-source transformation comprises code for inserting a jump address for the first state machine into the assembled and unlinked code.

17. The article of manufacture of claim 10, wherein the code for applying the source-to-source transformation comprises code for inserting jump addresses for states within the first state machine into the assembled and unlinked code.

18. The article of manufacture of claim 10, wherein:
the medium further comprises code for providing second variable declarations for second code for a second state machine, based on a previously specified name and input or output size for the second state machine;
the complete software application further includes the second code and the second variable declarations, wherein the second code describes the second state machine using the high-level language, the second code being independent of the processor implementation; and
the code for generating further utilizes the specified name and input or output size for the second state machine.

19. The article of manufacture of claim 18, wherein the code for applying the source-to-source transformation comprises code for inserting jump addresses for the first and second state machines into the assembled and unlinked code.

20. The article of manufacture of claim 18, wherein the code for applying the source-to-source transformation comprises code for inserting jump addresses for states within the first and second state machines into the assembled and unlinked code.

* * * * *